(12) United States Patent
Watanabe

(10) Patent No.: US 8,007,983 B2
(45) Date of Patent: Aug. 30, 2011

(54) PHOTOSENSITIVE RESIN COMPOSITION, PHOTOSENSITIVE ELEMENT USING SAME, METHOD FOR FORMING RESIST PATTERN, AND METHOD FOR PRODUCING PRINTED WIRING BOARD

(75) Inventor: Mitsuaki Watanabe, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 112 days.

(21) Appl. No.: 12/294,989

(22) PCT Filed: Mar. 14, 2007

(86) PCT No.: PCT/JP2007/055124
§ 371 (c)(1),
(2), (4) Date: Sep. 29, 2008

(87) PCT Pub. No.: WO2007/114014
PCT Pub. Date: Oct. 11, 2007

(65) Prior Publication Data
US 2010/0248162 A1    Sep. 30, 2010

(30) Foreign Application Priority Data

Mar. 31, 2006  (JP) ............... P2006-097897
Jul. 28, 2006  (JP) ............... P2006-206280

(51) Int. Cl.
G03F 7/027  (2006.01)
C08F 2/44  (2006.01)
C08F 2/46  (2006.01)

(52) U.S. Cl. ............ 430/281.1; 430/311; 430/315; 430/318; 430/285.1

(58) Field of Classification Search .......... None
See application file for complete search history.

(56) References Cited

U.S. PATENT DOCUMENTS

| 3,890,983 A * | 6/1975 | Sawada et al. ............... 131/343 |
| 4,197,132 A | 4/1980 | Tazawa et al. |
| 5,023,165 A * | 6/1991 | Fujikawa ............... 430/285.1 |
| 2005/0250931 A1 * | 11/2005 | Takagi ............... 528/310 |
| 2006/0066011 A1 * | 3/2006 | Oya ............... 264/330 |

FOREIGN PATENT DOCUMENTS

| JP | 02-001856 | | 1/1990 |
| JP | 04-145046 A | * | 5/1992 |
| JP | 04-195050 | | 7/1992 |
| JP | 09-255765 | | 9/1997 |
| JP | 2006-078558 | | 3/2006 |
| JP | 2006-201660 | | 8/2006 |
| TW | 200303452 | | 9/2003 |

OTHER PUBLICATIONS

Translation of the International Preliminary Report on Patentability mailed Oct. 30, 2008, for Application No. PCT/JP2007/055124.
Taiwanese Official Action dated Dec. 23, 2010, for TW Application No. 096111088.

* cited by examiner

Primary Examiner — Cynthia Hamilton
(74) Attorney, Agent, or Firm — Antonelli, Terry, Stout & Kraus, LLP.

(57) ABSTRACT

The photosensitive resin composition of the invention is characterized by comprising (A) a binder polymer, (B) a photopolymerizing compound with at least one polymerizable ethylenic unsaturated bond in the molecule, (C) a photopolymerization initiator and (D) a compound represented by the following general formula (1).

[Chemical Formula 1]

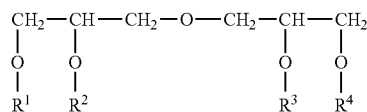

(1)

In formula (1), $R^1$, $R^2$, $R^3$ and $R^4$ are each independently hydrogen or a compound of the following general formula (2).

[Chemical Formula 2]

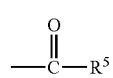

(2)

In general formula (2), $R^5$ represents a C4-30 hydrocarbon group.

19 Claims, 3 Drawing Sheets

PHOTOSENSITIVE RESIN COMPOSITION, PHOTOSENSITIVE ELEMENT USING SAME, METHOD FOR FORMING RESIST PATTERN, AND METHOD FOR PRODUCING PRINTED WIRING BOARD

TECHNICAL FIELD

The present invention relates to a photosensitive resin composition, and to a photosensitive element, a resist pattern forming method and a printed circuit board production process employing the same.

BACKGROUND ART

In the field of printed circuit board manufacturing there are commonly employed photosensitive elements obtained by forming photosensitive resin compositions and layers composed of photosensitive resin compositions (hereinafter referred to as "photosensitive resin composition layers") onto support films, as resist materials for etching or plating, and covering the photosensitive resin composition layers with protective films.

Such a photosensitive element is used to fabricate a printed circuit board by the following procedure, for example. Specifically, first the photosensitive resin composition layer of the photosensitive element is laminated onto a circuit-forming board. The side of the photosensitive resin composition layer opposite the side in contact with the support film is contact bonded to the side of the circuit-forming board on which the circuit is to be formed. When the protective film is positioned on the side which is to be contacted bonded with the photosensitive resin composition layer, therefore, the lamination operation is carried out while peeling off the protective film. Next, exposure is performed through a mask film or the like to form an image (pattern), and then the unexposed sections are removed with a developing solution to form a resist pattern. The resist pattern is in turn used as a mask for etching or plating, in order to form a circuit, and finally the cured sections are released and removed from the base.

DISCLOSURE OF THE INVENTION

Problems to be Solved by the Invention

With the ever increasing high densities of printed circuit boards in recent years, it is becoming more difficult to fabricate printed circuit boards with satisfactory productivity. One of the causes of lower productivity is static electricity generated due to peeling of the protective film and transport of the board during the steps up until removal of the unexposed section by the developing solution. Build up of such static electricity in the photosensitive resin composition layer leads to adhesion of contaminants before exposure, often making it impossible to form a high-resolution resist pattern. Investigation by the present inventors has also shown that, with circuit boards provided with through-holes, peeling of the support film from the photocured photosensitive resin composition layer can cause damage in the cured film at the openings of the through-holes, i.e. tent tearing. This is believed to be caused by the impact of discharge when the support film is peeled off.

For efficient production of printed circuit boards, it is important to adequately prevent such contaminant adhesion and tent tearing, but much research still remains to be conducted on techniques for improving the contaminant adhesion resistance and tent reliability of photosensitive elements.

The present invention has been completed in light of the circumstances described above, and its object is to provide a photosensitive resin composition that allows formation of photosensitive resin composition layers with excellent contaminant adhesion resistance while also allowing formation of cured films with excellent tent reliability, as well as a photosensitive element, resist pattern forming method and printed circuit board production process employing the same.

Means for Solving the Problems

In order to solve the problems mentioned above, the photosensitive resin composition of the invention is characterized by comprising (A) a binder polymer, (B) a photopolymerizing compound with at least one polymerizable ethylenic unsaturated bond in the molecule, (C) a photopolymerization initiator and (D) a compound represented by the following general formula (1).

[Chemical Formula 1]

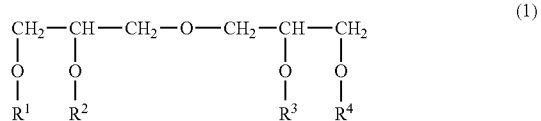

(1)

In general formula (1), $R^1$, $R^2$, $R^3$ and $R^4$ each independently represent hydrogen or a monovalent group represented by the following general formula (2).

[Chemical Formula 2]

(2)

In general formula (2), $R^5$ represents a C4-30 hydrocarbon group.

The photosensitive resin composition of the invention which contains a compound represented by general formula (1) in combination with components (A)-(C), satisfactorily exhibits the basic performance required of photosensitive resin compositions (sensitivity, resolution and adhesiveness), while allowing formation of photosensitive resin composition layers with excellent contaminant adhesion resistance and formation of cured films with excellent tent reliability. As a result it is possible to accomplish efficient production even with highly densified printed circuit boards.

While the reason for these effects exhibited by the photosensitive resin composition of the invention are not thoroughly understood, the present inventors conjecture as follows. That is, it is believed that adding the compound represented by general formula (1) above allows the photosensitive resin composition layer to absorb a sufficient amount of moisture to adequately prevent electrical charge buildup, while the excellent compatibility between the compound represented by general formula (1) and the photopolymerizing compound with an ethylenic unsaturated bond, and the suitable flexibility imparted to the cured film, minimize any influence on the basic performance of the photosensitive resin composition layer or the mechanical strength of the cured film, thus effectively preventing adhesion of contaminants onto the photosensitive resin composition layer and tent tearing in the cured film.

From the viewpoint of achieving an even higher level of basic performance (sensitivity, resolution and adhesiveness), antistatic properties and tent reliability as a photosensitive resin composition, the photosensitive resin composition of the invention preferably contains, as the compound represented by general formula (1), a compound of general formula (1) wherein at least one of $R^1$, $R^2$, $R^3$ and $R^4$ is a monovalent group represented by general formula (2) above, and $R^5$ in general formula (2) is a C4-30 aliphatic hydrocarbon group.

The photosensitive element of the invention is characterized by comprising a support film and a photosensitive resin composition layer composed of a photosensitive resin composition according to the invention as described above, formed on the support film.

Since the photosensitive element of the invention is provided with a photosensitive resin composition layer comprising a photosensitive resin composition of the invention, it allows photosensitive resin composition layers with excellent contaminant adhesion resistance to be formed on circuit-forming boards, and allows formation of cured films with excellent tent reliability. As a result it is possible to accomplish efficient production even with highly densified printed circuit boards.

The resist pattern forming method of the invention is characterized by laminating a photosensitive resin composition layer of a photosensitive element according to the invention on a circuit-forming board, irradiating the photosensitive resin composition layer with active light rays in an image pattern for photocuring of the exposed sections, and removing the sections other than the exposed sections.

According to the resist pattern forming method of the invention, a photosensitive element of the invention is used for lamination of a photosensitive resin composition layer on a circuit-forming board, in order to effectively prevent contaminant adhesion and tent tearing, and allow formation of satisfactory resist patterns. As a result it is possible to accomplish efficient production even with highly densified printed circuit boards.

The printed circuit board production process of the invention is characterized by etching or plating a circuit-forming board having a resist pattern formed by the resist pattern forming method of the invention. The process allows formation of satisfactory resist patterns by the resist pattern forming method of the invention on circuit-forming boards, so that highly densified printed circuit boards can be produced with high efficiency.

Effect of the Invention

The present invention provides a photosensitive resin composition that allows formation of photosensitive resin composition layers with excellent contaminant adhesion resistance while also allowing formation of cured films with excellent tent reliability, as well as a photosensitive element, resist pattern forming method and printed circuit board production process employing the same.

EXPLANATION OF REFERENCE NUMERALS

Figure 1:
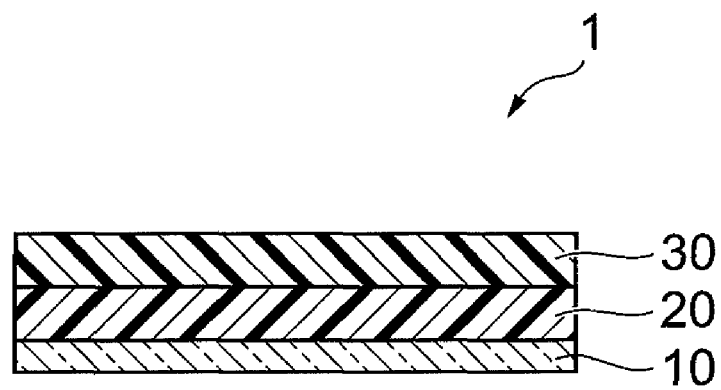
FIG. 1 is a schematic cross-sectional view of an embodiment of a photosensitive element according to the invention.

1: Photosensitive element, 10: support, 20: photosensitive resin composition layer, 30: protective film, 40: hole tear counting board, 41: round hole, 42: three continuous holes, 43: copper clad laminate.

BEST MODE FOR CARRYING OUT THE INVENTION

Embodiments of the invention will now be described in detail. The term "(meth)acrylic acid" as used with regard to the invention includes acrylic acid and its corresponding methacrylic acid, "(meth)acrylate" includes acrylate and its corresponding "methacrylate", and "(meth)acryloyl group" includes acryloyl and its corresponding methacryloyl group.

<Photosensitive Resin Composition>

The photosensitive resin composition of the invention will be explained first. The photosensitive resin composition of the invention comprises (A) a binder polymer (hereinafter also referred to as "component (A)"), (B) a photopolymerizing compound having at least one polymerizable ethylenic unsaturated bond in the molecule (hereinafter also referred to as "component (B)"), (C) a photopolymerization initiator (hereinafter also referred to as "component (C)"), and (D) a compound represented by the following general formula (1) (hereinafter also referred to as "component (D)").

[Chemical Formula 3]

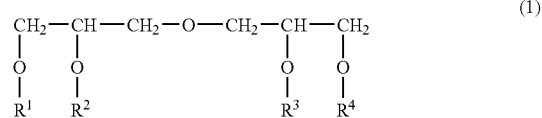

(1)

In general formula (1), $R^1$, $R^2$, $R^3$ and $R^4$ each independently represent hydrogen or a monovalent group represented by the following general formula (2).

[Chemical Formula 4]

(2)

In general formula (2), $R^5$ represents a C4-30 hydrocarbon group.

As examples for the (A) binder polymer there may be mentioned acrylic-based resins, styrene-based resins, epoxy-based resins, amide-based resins, amide/epoxy-based resins, alkyd-based resins, phenol-based resins and the like. Acrylic-based resins are preferred from the viewpoint of alkali developing properties. Any of these may be used alone or in combinations of two or more.

The (A) binder polymer may be produced, for example, by radical polymerization of a polymerizable monomer. As examples of such polymerizable monomers there may be mentioned styrene, polymerizable styrene derivatives substituted at the α-position or on the aromatic ring such as vinyltoluene and α-methylstyrene, acrylamides such as diacetone-acrylamide, acrylonitrile, vinyl alcohol ethers such as vinyl-n-butyl ether, (meth)acrylic acid alkyl esters, tetrahydrofurfuryl (meth)acrylate ester, dimethylaminoethyl (meth)acrylate ester, diethylaminoethyl (meth)acrylate ester, glycidyl (meth)acrylate ester, 2,2,2-trifluoro ethyl (meth) acrylate, 2,2,3,3-tetrafluoropropyl (meth)acrylate, (meth) acrylic acid, α-bromo(meth)acrylic acid, α-chlor(meth) acrylic acid, β-furyl(meth)acrylic acid, β-styryl(meth)acrylic acid, maleic acid, maleic acid monoesters such as maleic anhydride, monomethyl malate, monoethyl malate and monoisopropyl malate, and fumaric acid, cinnamic acid, α-cyanocinnamic acid, itaconic acid, crotonic acid, propiolic acid and the like.

As examples of (meth)acrylic acid alkyl esters there may be mentioned compounds represented by the following general formula (3), and the same compounds with the alkyl groups substituted with hydroxyl groups, epoxy groups, halogen atoms or the like.

[Chemical Formula 5]

$$CH_2=C(R^6)—COOR^7 \qquad (3)$$

In general formula (3), $R^6$ represents hydrogen or a methyl group, and $R^7$ represents a C1-12 alkyl group.

As examples of C1-12 alkyl groups represented by $R^7$ in general formula (3) there may be mentioned methyl, ethyl, propyl, butyl, pentyl, hexyl, heptyl, octyl, nonyl, decyl, undecyl, dodecyl and their structural isomers.

As specific examples of compounds represented by general formula (3) there may be mentioned methyl (meth)acrylate, ethyl (meth)acrylate, propyl (meth)acrylate, butyl (meth) acrylate, pentyl (meth)acrylate, hexyl (meth)acrylate, heptyl (meth)acrylate, octyl (meth)acrylate, 2-ethylhexyl (meth) acrylate, nonyl (meth)acrylate, decyl (meth)acrylate, undecyl (meth)acrylate, dodecyl (meth)acrylate and the like. Any of these may be used alone or in combinations of two or more.

The (A) binder polymer to be used for the invention preferably contains a carboxyl group from the viewpoint of obtaining a more satisfactory alkali developing property. Such a binder polymer (A) may be obtained, for example, by radical polymerization of a carboxyl group-containing polymerizable monomer with another polymerizable monomer. (Meth)acrylic acid mentioned above is preferred as a carboxyl group-containing polymerizable monomer.

The carboxyl group content of the (A) binder polymer (the proportion of polymerizable monomers with carboxyl groups with respect to the total polymerizable monomers used) is preferably 12-50 wt %, more preferably 12-40 wt %, even more preferably 15-30 wt % and most preferably 15-25 wt %, from the viewpoint of achieving a satisfactory balance between alkali developing property and alkali resistance. A carboxyl group content of less than 12 wt % will tend to result in an inferior alkali developing property, while a content of greater than 50 wt % will tend to lower the alkali resistance.

The acid value of the (A) binder polymer is preferably 50-250 mgKOH/g and more preferably 70-200 mgKOH/g. If the acid value is less than 50 mgKOH/g the developing time will tend to be longer, and if it is greater than 250 mgKOH/g the developing solution resistance of the photocured resist will tend to be reduced. When solvent development is carried out as the developing step, it is preferred to adjust the carboxyl group-containing polymerizable monomer to a smaller amount.

From the viewpoint of flexibility, the (A) binder polymer preferably also contains styrene or a styrene derivative as a polymerizable monomer. Using styrene or a styrene derivative as a polymerizable monomer will result in good adhesiveness and a satisfactory release property of the photosensitive resin composition.

From the viewpoint of more reliably improving the adhesiveness and release property of the photosensitive resin composition, the content of the styrene or styrene derivative is preferably 0.1-30 wt %, more preferably 1-28 wt % and even more preferably 1.5-27 wt % based on the total weight of the polymerizable monomers in the binder polymer (A). If the content is less than 0.1 wt % the adhesiveness of the photosensitive resin composition will tend to be reduced, while if it is greater than 30 wt % there will tend to be greater release fragmentation, necessitating a longer releasing time.

The term "styrene derivative" according to the invention means styrene wherein a hydrogen has been substituted with a substituent (an organic group such as alkyl, or a halogen atom or the like).

From the viewpoint of a satisfactory balance between mechanical strength and alkali developing property, the weight-average molecular weight of the (A) binder polymer is preferably 20,000-300,000 and more preferably 40,000-150,000. A weight-average molecular weight of less than 20,000 will tend to result in lower developing solution resistance, and greater than 300,000 will tend to lengthen the developing time. The weight-average molecular weight for the purpose of the invention is the value measured by gel permeation chromatography and calculated using a calibration curve prepared using standard polystyrene.

The (A) binder polymer used may be a single type or a combination of two or more types. As examples of binder polymers when two or more are used in combination, there may be mentioned two or more binder polymers composed of different copolymerizable components, two or more binder polymers with different weight-average molecular weights, and two or more binder polymers with different dispersibilities.

The photopolymerizing compound with at least one polymerizable ethylenic unsaturated bond (hereinafter referred to as "photopolymerizing compound") as component (B) will now be explained.

As examples for the (B) photopolymerizing compound there may be mentioned compounds obtained by reacting polyhydric alcohols with α,β-unsaturated carboxylic acids, bisphenol A-based (meth)acrylate compounds such as 2,2-bis (4-((meth)acryloxypolyethoxy)phenyl)propanes, 2,2-bis(4-((meth)acryloxypolypropoxy)phenyl)propanes and 2,2-bis (4-((meth)acryloxypolyethoxypolypropoxy)phenyl) propanes, compounds obtained by reacting glycidyl group-containing compounds with α,β-unsaturated carboxylic acids, urethane monomers such as urethane bond-containing (meth)acrylate compounds, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, (meth)acrylic acid alkyl esters and the like, although bisphenol A-based (meth)acrylate compounds or urethane bond-containing (meth)acrylate compounds are preferred as essential components. These may be used alone or in combinations of two or more.

As examples of 2,2-bis(4-((meth)acryloxypolyethoxy) phenyl)propanes there may be mentioned 2,2-bis(4-((meth) acryloxydiethoxy)phenyl)propane, 2,2-bis(4-((meth)acryloxytriethoxy)phenyl)propane, 2,2-bis(4-((meth) acryloxytetraethoxy)phenyl)propane, 2,2-bis(4-((meth) acryloxypentaethoxy)phenyl)propane, 2,2-bis(4-((meth) acryloxyhexaethoxy)phenyl)propane, 2,2-bis(4-((meth) acryloxyheptaethoxy)phenyl)propane, 2,2-bis(4-((meth) acryloxyoctaethoxy)phenyl)propane, 2,2-bis(4-((meth) acryloxynonaethoxy)phenyl)propane, 2,2-bis(4-((meth) acryloxydecaethoxy)phenyl)propane, 2,2-bis(4-((meth) acryloxyundecaethoxy)phenyl)propane, 2,2-bis(4-((meth) acryloxydodecaethoxy)phenyl)propane, 2,2-bis(4-((meth) acryloxytridecaethoxy)phenyl)propane, 2,2-bis(4-((meth) acryloxytetradecaethoxy)phenyl)propane, 2,2-bis(4-((meth)

acryloxypentadecaethoxy)phenyl)propane, 2,2-bis(4-((meth)acryloxyhexadecaethoxy)phenyl)propane and the like. Of these, 2,2-bis(4-(methacryloxypentaethoxy)phenyl)propane is commercially available as BPE-500 (product of Shin-Nakamura Chemical Co., Ltd.), and 2,2-bis(4-(methacryloxypentadecaethoxy)phenyl)propane is commercially available as BPE-1300 (product of Shin-Nakamura Chemical Co., Ltd.). These may be used alone or in combinations of two or more.

As examples of 2,2-bis(4-((meth)acryloxypolypropoxy) phenyl)propanes there may be mentioned 2,2-bis(4-((meth) acryloxydipropoxy)phenyl)propane, 2,2-bis(4-((meth)acryloxytripropoxy)phenyl)propane, 2,2-bis(4-((meth)acryloxytetrapropoxy)phenyl)propane, 2,2-bis(4-((meth)acryloxypentapropoxy)phenyl)propane, 2,2-bis(4-((meth)acryloxyhexapropoxy)phenyl)propane, 2,2-bis(4-((meth)acryloxyheptapropoxy)phenyl)propane, 2,2-bis(4-((meth)acryloxyoctapropoxy)phenyl)propane, 2,2-bis(4-((meth)acryloxynonapropoxy)phenyl)propane, 2,2-bis(4-((meth)acryloxydecapropoxy)phenyl)propane, 2,2-bis(4-((meth)acryloxyundecapropoxy)phenyl)propane, 2,2-bis(4-((meth)acryloxydodecapropoxy)phenyl)propane, 2,2-bis(4-((meth)acryloxytridecapropoxy)phenyl)propane, 2,2-bis(4-((meth)acryloxytetradecapropoxy)phenyl)propane, 2,2-bis(4-((meth)acryloxypentadecapropoxy)phenyl)propane, 2,2-bis(4-((meth)acryloxyhexadecapropoxy)phenyl)propane and the like. These may be used alone or in combinations of two or more.

As examples of 2,2-bis(4-((meth)acryloxypolyethoxypolypropoxy)phenyl)propanes there may be mentioned 2,2-bis(4-((meth)acryloxydiethoxyoctapropoxy)phenyl)propane, 2,2-bis(4-((meth)acryloxytetraethoxytetrapropoxy) phenyl)propane, 2,2-bis(4-((meth)acryloxyhexaethoxyhexapropoxy)phenyl)propane and the like. These may be used alone or in combinations of two or more.

As examples of compounds obtained by reacting polyhydric alcohols with α,β-unsaturated carboxylic acids there may be mentioned polyethyleneglycol di(meth)acrylates with 2-14 ethylene groups, polypropyleneglycol di(meth) acrylates with 2-14 propylene groups, polyethylenepolypropyleneglycol di(meth)acrylates with 2-14 ethylene groups and 2-14 propylene groups, trimethylolpropane di(meth) acrylate, trimethylolpropane tri(meth)acrylate, trimethylolpropaneethoxy tri(meth)acrylate, trimethylolpropanediethoxy tri(meth)acrylate, trimethylolpropanetriethoxy tri (meth)acrylate, trimethylolpropanetetraethoxy tri(meth) acrylate, trimethylolpropanepentaethoxy tri(meth)acrylate, tetramethylolmethane tri(meth)acrylate, tetramethylolmethane tetra(meth)acrylate, polypropyleneglycol di(meth) acrylates with 2-14 propylene groups, dipentaerythritol penta (meth)acrylate, dipentaerythritol hexa(meth)acrylate and the like.

As examples of urethane monomers there may be mentioned addition reaction products of (meth)acrylic monomers with an OH group at the β position and diisocyanate compounds such as isophorone diisocyanate, 2,6-toluene diisocyanate, 2,4-toluene diisocyanate and 1,6-hexamethylene diisocyanate, as well as tris((meth)acryloxytetraethyleneglycol isocyanate) hexamethyleneisocyanurate, EO-modified urethane di(meth)acrylate, and EO and PO-modified urethane di(meth)acrylate. "EO" stands for ethylene oxide, and an EO-modified compound has a block structure of ethylene oxide groups. "PO" stands for propylene oxide, and a PO-modified compound has a block structure of propylene oxide groups. As an example of an EO-modified urethane di(meth) acrylate there may be mentioned UA-11 by Shin-Nakamura Chemical Co., Ltd. As an example of an EO,PO-modified urethane di(meth)acrylate compound there may be mentioned UA-13 (product of Shin-Nakamura Chemical Co., Ltd.).

As examples of photopolymerization initiators for component (C) there may be mentioned aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone and 2-benzyl-2-dimethylamino-1-(4-morpholinophenyl)-butanone-1,2-methyl-1-[4-(methylthio)phenyl]-2-morpholinopropanone-1, quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone, benzoinether compounds such as benzoinmethyl ether, benzomethyl ether and benzoinphenyl ether, benzoin compounds such as benzoin, methylbenzoin and ethylbenzoin, benzyl derivatives such as benzyldimethylketal, 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, acridine derivatives such as 9-phenylacridine and 1,7-bis(9,9'-acridinyl)heptane, and N-phenylglycines, N-phenylglycine derivatives, coumarin-based compounds, oxazole-based compounds and the like. The aryl substituents of any two 2,4,5-triarylimidazoles may be identical to provide a symmetrical compound, or they may be different to provide an asymmetrical compound. A combination of a thioxanthone-based compound and tertiary amine compound may also be used, such as a combination of diethylthioxanthone and dimethylaminobenzoic acid. From the viewpoint of adhesiveness and sensitivity, a 2,4,5-triarylimidazole dimer is more preferred. They may be used alone or in combinations of two or more.

The compound represented by general formula (1) above as component (D) may be a commercially marketed product. As examples of commercially available products there may be mentioned "Electrostripper EM-1" and "Electrostripper EM-1A" (both trade names of Kao Corp.).

In general formula (1), $R^1$-$R^4$ are hydrogens or monovalent groups represented by general formula (2) above, but according to the invention the proportion of monovalent groups represented by general formula (2) distributed among $R^1$-$R^4$ is preferably 10-80% and more preferably 20-50% in component (D). If the distribution of groups represented by general formula (2) is greater than 80% the resolution and adhesiveness will tend to be lower, while if it is less than 10% the antistatic effect will tend to be weakened.

In the photosensitive resin composition of the invention, the ratio [$M_{OH}/M_{ESTER}$] between the total moles of hydroxyl groups $M_{OH}$ in the compound represented by general formula (1) and the total moles of ester groups (when $R^1$-$R^4$ are monovalent groups represented by general formula (2)) $M_{ESTER}$ is preferably in the range of 0.1-4 and more preferably in the range of 0.25-1.

When the compound represented by general formula (1) has a monovalent group represented by general formula (2), $R^5$ in general formula (2) is preferably a C4-30 aliphatic hydrocarbon group, more preferably a C4-25 aliphatic hydrocarbon group, even more preferably a C5-20 aliphatic hydrocarbon group and most preferably a C10-20 aliphatic hydrocarbon group. Diglycerin oleates may be mentioned as examples of such compounds. Diglycerin oleates are commercially available as, for example, "Electrostripper EM-1" and "Electrostripper EM-1A" (both trade names of Kao Corp.).

The photosensitive resin composition of the invention preferably contains a mixture of compounds represented by general formula (1) wherein $R^1$, $R^2$, $R^3$ and $R^4$ each independently represent hydrogen or $-CO-C_{17}H_{33}$, and the distribution of $-CO-C_{17}H_{33}$ among $R^1$, $R^2$, $R^3$ and $R^4$ is 10-80%. If the distribution of $-CO-C_{17}H_{33}$ exceeds 80% the resolution and adhesiveness will tend to be low, while if it is less than 10% the antistatic effect will tend to be weakened. An example of a commercially available mixture of this type is "Electrostripper EM-1" (trade name of Kao Corp., $-CO-C_{17}H_{33}$ distribution: 40%) and "Electrostripper EM-1A" (trade name of Kao Corp., $-CO-C_{17}H_{33}$ distribution: 30%).

The content of the (A) binder polymer is preferably 30-80 parts by weight and more preferably 50-70 parts by weight with respect to 100 parts by weight as the total of component (A) and component (B). If the content is less than 40 parts by weight the photocured composition may be too fragile, tending to result in inferior coatability when used as a photosensitive element, while if it is greater than 80 parts by weight the photosensitivity will tend to be insufficient and the photocured composition will be brittle.

The content of the (B) photopolymerizing compound is preferably 20-60 parts by weight and more preferably 30-55 parts by weight with respect to 100 parts by weight as the total of component (A) and component (B). If the content is less than 20 parts by weight the photosensitivity will tend to be insufficient, while if it is greater than 60 parts by weight the photocured composition will be too fragile, tending to result in inferior coatability when used as a photosensitive element.

The content of the (C) photopolymerization initiator is preferably 0.01-20 parts by weight and more preferably 0.2-5 parts by weight with respect to 100 parts by weight as the total of component (A) and component (B). If the content is less than 0.01 part by weight the photosensitivity will tend to be insufficient, and if it is greater than 20 parts by weight the absorption on the surface of the composition during exposure will increase, tending to result in insufficient photocuring of the interior.

The content of the (D) compound represented by general formula (1) is preferably 0.01-20 parts by weight and more preferably 0.5-5 parts by weight with respect to 100 parts by weight as the total of component (A) and component (B). If the content is less than 0.01 part by weight the antistatic effect will tend to be insufficient, while if it is greater than 20 parts by weight the adhesiveness with copper will tend to be lower.

The photosensitive resin composition of the invention may, if necessary, also contain additives including dyes such as malachite green, coloring agents such as tribromophenylsulfone, leuco crystal violet or the like, thermal development inhibitors, plasticizers such as p-toluenesulfonamide, pigments, fillers, antifoaming agents, flame retardants, stabilizers, tackifiers, leveling agents, release accelerators, antioxidants, aromatics, imaging agents, thermal crosslinking agents and the like, either alone or in combinations of two or more. The content of such additives is preferably about 0.01-20 parts by weight with respect to 100 parts by weight as the total of component (A) and component (B).

The photosensitive resin composition of the invention may, if necessary, be dissolved in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, for coating as a solution with a solid content of about 30-60 wt %.

The photosensitive resin composition of the invention is preferably coated as a liquid resist onto the surface of a metal such as copper, a copper-based alloy, nickel, chromium, iron or an iron-based alloy such as stainless steel, and preferably copper or a copper-based alloy or iron-based alloy, and then dried and subsequently covered with a protective film if necessary, or else used in the form of a photosensitive element.

The thickness of the photosensitive resin composition layer formed from the photosensitive resin composition of the invention will differ depending on the use, but the post-drying thickness is preferably 1-200 μm and more preferably 1-100 μm. A thickness of less than 1 μm will tend to hamper industrial coating, while a thickness of greater than 200 μm will improve the tent reliability but will tend to result in insufficient sensitivity, thus impairing the photocuring property of the resist base.

<Photosensitive Element>

The photosensitive element of the invention is characterized by comprising a support film and a photosensitive resin composition layer comprising a photosensitive resin composition according to the invention as described above, formed on the support film. The photosensitive element of the invention preferably also comprises a protective film laminated in contact with the side of the photosensitive resin composition layer opposite the support film side.

FIG. 1 is a schematic view of the cross-sectional structure of a photosensitive element according to a preferred embodiment. As shown in FIG. 1, the photosensitive element 1 comprises a support film 10, a photosensitive resin composition layer 20 formed on the support film 10 and a protective film 30 formed on the photosensitive resin composition layer 20. The photosensitive resin composition layer 20 is a layer formed using a photosensitive resin composition of the invention as described above.

The support film 10 may be a polymer film having heat resistance and solvent resistance, such as polyethylene terephthalate, polypropylene, polyethylene or polyester, for example. If transparency is desired, it is preferred to use a polyethylene terephthalate film. Since such polymer films must be subsequently removable from the photosensitive resin composition layer 20, they must not be of a material or be surface treated in a manner that would prevent their removal. The thickness of the support film 10 is preferably 1-100 μm and more preferably 1-30 μm. If the thickness of the support film is less than 1 μm the mechanical strength will tend to be lower and the support film will be prone to tearing during coating of the photosensitive resin composition or when the support film is released before development, while if it is greater than 100 μm the resolution will tend to be lower and the cost will tend to be increased.

The photosensitive resin composition layer 20 may be formed by, for example, coating the photosensitive resin composition of the invention on the support film 10 and drying it. The coating may be accomplished by a publicly known method using, for example, a roll coater, comma coater, gravure coater, air knife coater, die coater, bar coater, spray coater or the like. The drying may be carried out at 70-150° C. for about 5-30 minutes.

When the photosensitive resin composition is coated onto the support film 10, it is preferably coated as a solution of the photosensitive resin composition in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, as necessary, at a solid content of about 30-60 wt %. In this case, the amount of residual organic solvent in the dried photosensitive resin composition layer 20 is preferably no greater than 2 wt % from the viewpoint of preventing diffusion of the organic solvent in subsequent steps.

The thickness of the photosensitive resin composition layer 20 will differ depending on the use, but the post-drying thickness is preferably 1-200 μm and more preferably 1-100 μm. A thickness of less than 1 μm will tend to hamper industrial coating, while a thickness of greater than 200 μm will improve the tent reliability but will tend to result in insufficient sensitivity, thus impairing the photocuring property of the resist base.

The protective film 30 may be a polymer film having heat resistance and solvent resistance, such as polyethylene terephthalate, polypropylene, polyethylene or polyester, for example. As examples of commercially available products there may be mentioned "ALFAN MA410" and "E-200C" by Oji Paper Co., Ltd., polypropylene films by Shin-Etsu Film Co., Ltd. or polyethylene terephthalate films of the PS series such as "PS-25" by Teijin, Ltd., but there is no restriction to these. The same type of polymer film as the support film described above may be used as the protective film in the photosensitive element 1.

The adhesive force between the protective film 30 and photosensitive resin composition layer 20 is preferably lower than the adhesive force between the photosensitive resin composition layer 20 and support film 10, in order to facilitate release of the protective film 30 from the photosensitive resin composition layer 20.

The protective film is preferably a low fisheye film. "Fisheyes" are contaminants, insoluble matter and oxidative degradation products that become incorporated into films during their production by heat-fusion, kneading, extrusion, biaxial stretching and casting of film materials.

The thickness of the protective film 30 is preferably 1-100 μm, more preferably 5-50 μm, even more preferably 5-30 μm and most preferably 15-30 μm. If the thickness is less than 1 μm the protective film will tend to be more prone to tearing during lamination, while if it is greater than 100 μm the cost of the film will be increased.

The photosensitive element 1 may also comprise interlayers such as a cushion layer, adhesive layer, photoabsorbing layer and gas barrier layer as necessary.

The photosensitive element 1 may be stored as is in the form of a flat sheet, or as a roll wound up on a winding core with a cylindrical or other shape. In the latter case, it is preferably wound with the support film 10 on the outermost side.

When the photosensitive element 1 has a two-layer construction with no protective film 30, the photosensitive element may be stored as is in the form of a flat sheet, or a protective film may be laminated on the side of the photosensitive resin composition layer 20 opposite the support film side and the laminate wound up as a roll on a winding core with a cylindrical or other shape.

The winding core is not particularly restricted so long as it is a conventional one, and as examples there may be mentioned plastics such as polyethylene resin, polypropylene resin, polystyrene resin, polyvinyl chloride resin, ABS resin (acrylonitrile-butadiene-styrene copolymer) and the like. From the viewpoint of edge protection, an edge separator is preferably situated at the edge of the photosensitive element (photosensitive element roll) that has been wound up into a roll, and from the viewpoint of preventing edge fusion, the edge separator is preferably moisture-proof. For packaging of the photosensitive element 1, it is preferably bundled with a low moisture permeable black sheet.

<Resist Pattern Forming Method>

The resist pattern forming method of the invention is a method in which a photosensitive resin composition layer composed of a photosensitive resin composition of the invention or the photosensitive resin composition layer of a photosensitive element of the invention is laminated, prescribed sections of the photosensitive resin composition layer are irradiated with active light rays for photocuring of the exposed sections, and the sections other than the exposed sections are then removed. A "circuit-forming board" is a board comprising an insulating layer and a conductive layer formed on the insulating layer.

When the photosensitive element 1 used in the resist pattern forming method of the invention has a protective film, a resist pattern is formed by a method comprising a first step in which the protective film 30 of the photosensitive element 1 is gradually released from the photosensitive resin composition layer 20 while the sections on the photosensitive resin composition layer 20 side that are gradually exposed are contact bonded to the side of the circuit-forming board on which the circuit is to be formed, thus laminating the photosensitive resin composition layer 20 onto the circuit-forming board, a second step in which prescribed sections of the photosensitive resin composition layer 20 which are to be exposed are irradiated with active light rays to form exposed sections, and a third step in which the unexposed sections are removed leaving the exposed sections.

The method of laminating the photosensitive resin composition layer on the circuit-forming board in the first step may be a method in which, after removing the protective film, the photosensitive resin composition layer is heated while contact bonding the photosensitive resin composition layer to the circuit-forming board. The procedure is preferably carried out under reduced pressure from the viewpoint of adhesiveness and follow-up property. For lamination of the photosensitive element, the photosensitive resin composition layer and/or circuit-forming board is preferably heated to 70-130° C. and the contact bonding pressure is preferably about 0.1-1.0 MPa (about 1-10 kgf/cm$^2$), although there is no particular restrictions to these conditions. If the photosensitive resin composition layer is heated at 70-130° C. as mentioned above it is not necessary to subject the circuit-forming board to preheating beforehand, but the circuit-forming board may also be preheated for further enhanced laminating properties. The surface of the circuit-forming board on which the photosensitive resin composition layer is to be laminated is not particularly restricted but will usually be a metal surface.

The method of forming the exposed sections in the second step may be a method of irradiation with active light rays into an image form, through a negative or positive mask pattern known as artwork (mask exposure method). When the support film on the photosensitive resin composition layer is transparent to the active light rays, the active light rays may be irradiated through the support film, and when the support film is non-transparent, the active light rays may be irradiated onto the photosensitive resin composition layer after removal of the support film. A method of irradiating active light rays in an image pattern by a direct writing process using a laser exposure method may also be employed.

The light source for the active light rays may be a publicly known light source such as, for example, a carbon arc lamp, mercury vapor arc lamp, high-pressure mercury lamp, xenon lamp or the like, which efficiently emits ultraviolet rays or visible light. A light source that efficiently emits ultraviolet rays or visible light, such as an Ar ion laser or semiconductor laser, may also be used. There may also be used a lamp that efficiently emits other visible light rays, such as a photoflood lamp or sun lamp.

As a method for removing the sections other than the exposed sections in the third step, when a support film is present on the photosensitive resin composition layer, there may be mentioned a method in which the support film is first removed and then the sections other than the exposed sections are removed by development such as wet development, dry development or the like. This procedure results in formation of a resist pattern.

In the case of wet development, a developing solution suitable for photosensitive resin compositions may be used, such as an aqueous alkali solution, aqueous developing solution or organic solvent-based developing solution, and development may be accomplished by a publicly known method such as spraying, reciprocal dipping, brushing, scrapping or the like.

The developing solution used is one which is safe and stable and easily manageable, such as an aqueous alkali solution. As bases for the aqueous alkali solution there may be used, for example, alkali hydroxides such as hydroxides of lithium, sodium, potassium and the like, alkali carbonates such as carbonates or bicarbonates of lithium, sodium, potassium, ammonium and the like, alkali metal phosphates such as potassium phosphate and sodium phosphate, and alkali metal pyrophosphates such as sodium pyrophosphate and potassium pyrophosphate.

The aqueous alkali solution used for development is preferably a 0.1-5 wt % sodium carbonate dilute solution, a 0.1-5 wt % potassium carbonate dilute solution, a 0.1-5 wt % sodium hydroxide dilute solution or a 0.1-5 wt % sodium tetraborate dilute solution. The pH of the aqueous alkali solution used for development is preferably in the range of 9-11, and the temperature is adjusted as appropriate for the developing property of the photosensitive resin composition layer. The aqueous alkali solution may also contain added surfactants, antifoaming agents, and small amounts of organic solvent to accelerate development.

An aqueous developing solution used may be composed of water and an aqueous alkali solution or one or more different organic solvents. As examples of alkaline substances for aqueous alkali solutions other than those already referred to above there may be mentioned borax, or sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine and the like. The pH of the developing solution is preferably in a range allowing sufficient development of the resist, and is preferably pH 8-12 and more preferably pH 9-10.

As examples of organic solvents there may be mentioned acetone alcohol, acetone, ethyl acetate, alkoxyethanols with C1-4 alkoxy groups, ethyl alcohol, isopropyl alcohol, butyl alcohol, diethyleneglycol monomethyl ether, diethyleneglycol monoethyl ether, diethyleneglycol monobutyl ether and the like. They may be used alone or in combinations of two or more. The concentration of the organic solvent is normally preferred to be 2-90 wt %, and the temperature may be adjusted as appropriate for the developing property. The aqueous developing solution may also contain small amounts of added surfactants, antifoaming agents and the like.

As examples of organic solvent-based developing solutions using organic solvents alone there may be mentioned 1,1,1-trichloroethane, N-methylpyrrolidone, N,N-dimethylformamide, cyclohexanone, methyl isobutyl ketone and γ-butyrolactone. Water is preferably added to these organic solvents in a range of 1-20 wt % for anti-flammability.

Two or more different developing solutions may also be used in combination if necessary.

As examples of developing systems there may be mentioned dipping systems, paddle systems, spray systems such as high-pressure spray systems, and brushing or slapping systems. Among these, a high-pressure spray system is preferably used from the viewpoint of improved resolution.

Post-development treatment in the resist pattern forming method of the invention may consist of heating at about 60-250° C. or exposure at about 0.2-10 mJ/cm$^2$ if necessary for further curing of the resist pattern.

As post-development treatment, etching of the metal surfaces may be accomplished using, for example, a cupric chloride solution, ferric chloride solution, alkali etching solution or the like. A ferric chloride solution is preferred among those mentioned above from the viewpoint of achieving a satisfactory etch factor.

<Printed Circuit Board Production Process>

The printed circuit board production process of the invention is a process characterized in that a circuit-forming board having a resist pattern formed by the resist pattern forming method of the invention is etched or plated.

The etching or plating of the circuit-forming board is carried out on the conductive layer of the circuit-forming board using the formed resist pattern as a mask. The etching solution may be a cupric chloride solution, ferric chloride solution, alkali etching solution, hydrogen peroxide-based etching solution or the like, with a ferric chloride solution being preferred for a more satisfactory etch factor. The type of plating used when plating is carried out may be, for example, copper plating such as copper sulfate plating or copper pyrophosphate plating, solder plating such as high throwing solder plating, nickel plating such as Watt bath (nickel sulfate-nickel chloride) plating or nickel sulfaminate plating, or gold plating such as hard gold plating or soft gold plating.

After completion of the etching or plating, the resist pattern is released, for example, with an aqueous solution of stronger alkalinity than the aqueous alkali solution used for development. The strongly alkaline aqueous solution used here may be, for example, a 0.1-10 wt % sodium hydroxide aqueous solution or a 0.1-10 wt % potassium hydroxide aqueous solution. The releasing system may be, for example, a dipping system, spraying system or the like. These releasing systems may be used alone or in combination.

By applying the production process described above it is possible to satisfactorily produce a printed circuit board such as a multilayer printed circuit board with small through-holes.

EXAMPLES

The present invention will now be explained in greater detail based on examples and comparative examples, with the understanding that the invention is in no way limited to the examples.

<Synthesis of Component (A)1>

In a flask equipped with a stirrer, reflux condenser, thermometer, dropping funnel and nitrogen gas inlet tube there was added 400 g of a mixture of methylcellosolve and toluene (methylcellosolve/toluene=3/2 (weight ratio), hereinafter referred to as solution "s"), and the mixture was stirred while blowing in nitrogen gas and heated to 80° C. As polymerizable monomer there was prepared a mixture of 125 g of methacrylic acid, 250 g of methyl methacrylate, 100 g of butyl acrylate, 25 g of styrene and 0.8 g of azobisisobutyronitrile (hereinafter referred to as solution "a"), and solution "a" was added dropwise to the 80° C.-heated solution "s" over a period of 4 hours, after which the mixture was kept for 2 hours at 80° C. while stirring. Also, a solution of 1.2 g of azobisisobutyronitrile in 100 g of solution "s" was added dropwise to the flask over a period of 10 minutes. After keeping the dropped solution at 80° C. for 3 hours while stirring, it was heated to 90° C. over a period of 30 minutes. The solution was warmed at 90° C. for 2 hours, and then cooled to obtain a binder polymer solution. Acetone was added to the binder polymer solution, and the non-volatilizing component content (solid portion) was adjusted to 50 wt % to obtain a binder polymer solution as component (A)1. The weight-average molecular weight of the obtained binder polymer was 80,000. The weight-average molecular weight was measured by gel permeation chromatography, and calculation was performed using a standard polystyrene calibration curve. The GPC conditions were as follows.

(Gpc Conditions)
Pump: Hitachi L-6000 (Hitachi, Ltd.)
Column: Gelpack GL-R420+Gelpack GL-R430+Gelpack GL-R440 (total: 3) (all trade names of Hitachi Chemical Co., Ltd.)
Eluent: tetrahydrofuran
Measuring temperature: 25° C.
Flow rate: 2.05 mL/min
Detector: Hitachi L-3300 RI (Hitachi, Ltd.).

<Synthesis of Component (A)2>

A binder polymer solution (non-volatilizing components (solid portion): 50 wt %) was prepared as component (A)2 by the same procedure as for synthesis of component (A)1, except that 100 g of methacrylic acid, 275 g of methyl methacrylate and 125 g of ethyl acrylate were used as polymerizable monomer. The weight-average molecular weight of the obtained binder polymer was 80,000.

Examples 1-4 and Comparative Example 1

The materials shown in Table 1 were combined in the amounts listed in the table (units: parts by weight) to obtain photosensitive resin composition solutions for Examples 1-4 and Comparative Example 1.

The solution of the obtained photosensitive resin composition was then evenly coated onto a 16 μm-thick polyethylene terephthalate film ("G2-16", trade name of Teijin, Ltd.) as the support, and then dried for 10 minutes with a hot air convection drier at 100° C. and covered with a polyethylene protective film ("NF-13", trade name of Tamapoly Co., Ltd.) to obtain photosensitive elements for Examples 1-4 and Comparative Example 1. The dried film thickness of the photosensitive resin composition layer was 40 μm.

[Evaluation of Tent Reliability and Contaminant Adhesion Resistance]

Figure 2:
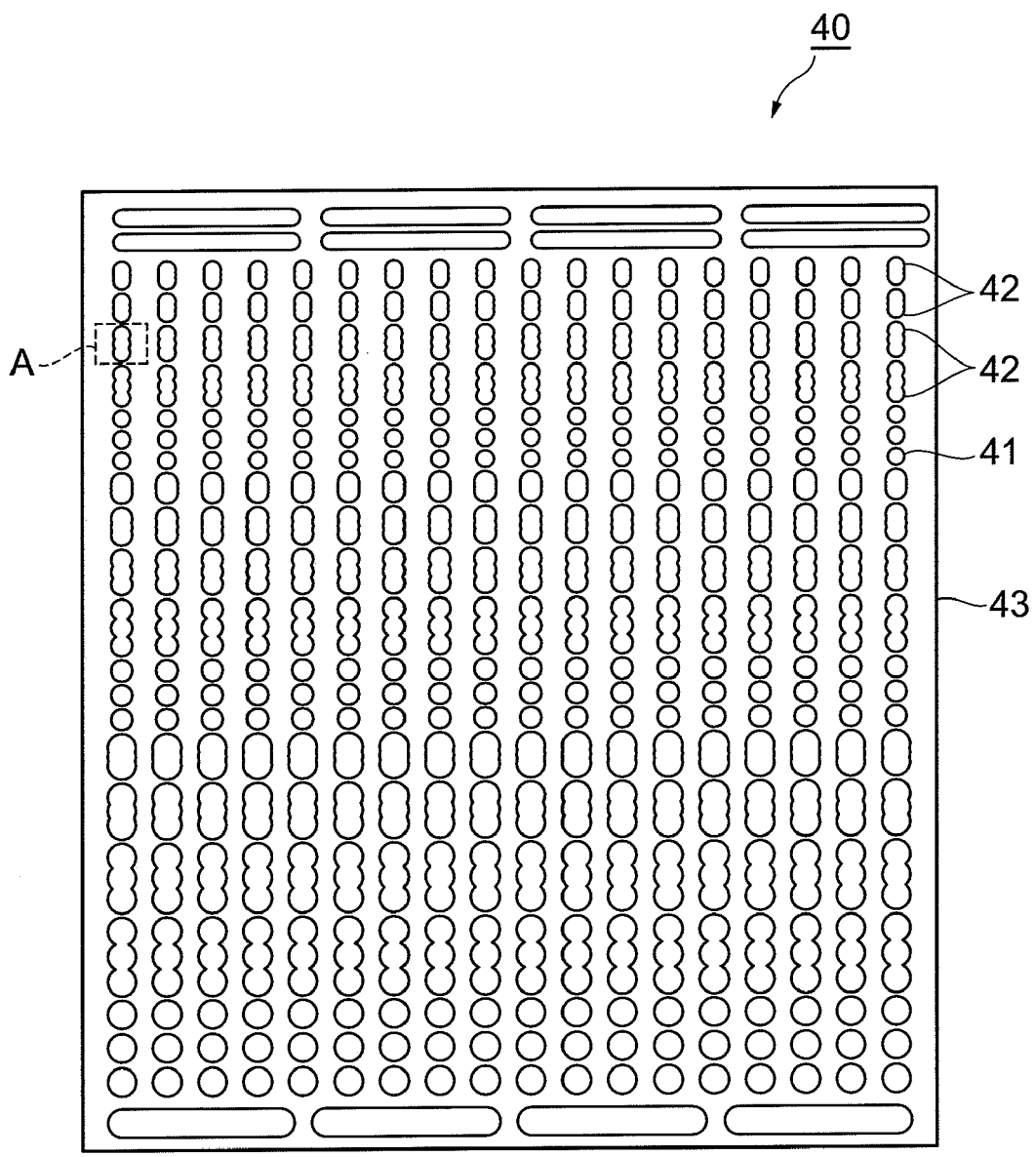
FIG. 2 is a plan view of a hole tear counting board used for evaluation of the irregular tent tear rate for the examples.
Figure 3:
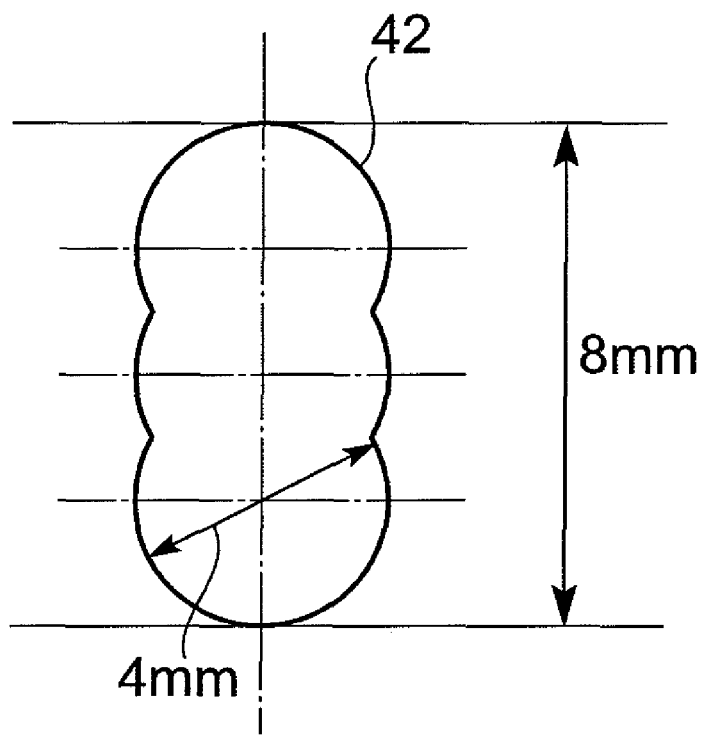
FIG. 3 is a magnified view of three continuous holes in region A of FIG. 2.

As shown in FIG. 2, a 1.6 mm-thick copper clad laminate ("MCL-E67", trade name of Hitachi Chemical Co., Ltd.) having 35 μm-thick copper foils attached on both sides was cut with a die cutter into a round hole 41 and strings of three continuous round holes 42, the hole diameters being 4 mm, 5 mm and 6 mm. The burrs produced by forming the round holes 41 and the three continuous round holes 42 were removed using a polisher (Sankei Co., Ltd.) with a #600 equivalent brush, to prepare a hole tear counting board for use.

The obtained hole tear counting board 40 was heated to 80° C., and the photosensitive elements obtained in Examples 1-4 and Comparative Example 1 were each placed on the copper surface and laminated under conditions of 120° C., 0.4 MPa while releasing the protective film, with the photosensitive resin composition layer on the hole tear counting board 40 side. After lamination the hole tear counting board 40 was cooled, and when the hole tear counting board reached a temperature of 23° C., a 41-step tablet ("Hitachi 41-step tablet", trade name of Fuji Film Co.) was bonded to the polyethylene terephthalate film surface and an exposure apparatus equipped with a high-pressure mercury lamp ("HMW-201B", trade name of Orc Manufacturing Co., Ltd.) was used for photocuring of the photosensitive resin composition layer with an exposure dose for photocuring of 23 steps.

After exposure, the laminate was allowed to stand at room temperature (25° C.) for 15 minutes, and then the polyethylene terephthalate support film was released. The number of

TABLE 1

|  |  | Example 1 | Example 2 | Example 3 | Example 4 | Comparative Example 1 |
|---|---|---|---|---|---|---|
| Component (A) | Component (A)1 | 100 (Solid content: 50) | 100 (Solid content: 50) | — | — | 100 (Solid content: 50) |
|  | Component (A)2 | — | — | 100 (Solid content: 50) | 100 (Solid content: 50) | — |
| Component (B) | BPE-500*1 | 30 | 30 | 30 | 30 | 30 |
|  | FA-MECH*2 | 20 | 20 | 20 | 20 | 20 |
| Component (C) | 2-(o-Chlorophenyl)-4,5-diphenylimidazole dimer | 5 | 5 | 5 | 5 | 5 |
|  | N,N'-Tetraethyl-4,4'-diaminobenzophenone | 0.2 | 0.2 | 0.2 | 0.2 | 0.2 |
| Component (D) | Sample A*3 | 5 | — | 5 | — | — |
|  | Sample B*4 | — | 5 | — | 5 | — |
| Additives | Malachite green | 0.05 | 0.05 | 0.05 | 0.05 | 0.05 |
|  | Leuco crystal violet | 0.5 | 0.5 | 0.5 | 0.5 | 0.5 |
|  | Acetone | 15 | 15 | 15 | 15 | 15 |
| Solvents | Toluene | 10 | 10 | 10 | 10 | 10 |
|  | Methanol | 10 | 10 | 10 | 10 | 10 |

Units: Parts by weight
The materials listed in Table 1 are the following.
*1 2,2-bis(4-(Methacryloxypentadecaethoxy)phenyl) ("BPE-500", trade name of Shin-Nakamura Chemical Co., Ltd.)
*2 γ-Chloro-β-hydroxypropyl-β'-methacryloyloxyethyl-o-phthalate ("FA-MECH", trade name of Hitachi Chemical Co., Ltd.)
*3 "Electrostripper EM-1A" (trade name of Kao Corp.) (Mixture of compounds represented by general formula (1) wherein $R^1, R^2, R^3$ and $R^4$ each independently represent hydrogen or $-CO-C_{17}H_{33}$, and the distribution of $-CO-C_{17}H_{33}$ among $R^1, R^2, R^3$ and $R^4$ is 30%.)
*4 "Electrostripper EM-1" (trade name of Kao Corp.) (Mixture of
compounds represented by general formula (1) wherein $R^1, R^2, R^3$ and $R^4$ each independently represent hydrogen or $-CO-C_{17}H_{33}$, and the distribution of $-CO-C_{17}H_{33}$ among $R^1, R^2, R^3$ and $R^4$ is 40%.)

hole tears in the cured film that formed in the three continuous holes 42 were counted, and the irregular tent tear rate was calculated. A lower irregular tent tear rate may be considered to be more satisfactory tent reliability.

As an evaluation of the contaminant adhesion resistance, the polyethylene protective film of the photosensitive element was peeled off and 100 pieces of wrapping paper (product of Tokyo Nihon Yushi) cut to 3 mm square were dispersed evenly onto the exposed photosensitive resin composition layer, after which the side on which the wrapping paper pieces had been placed was directed downward. The number of wrapping paper pieces remaining on the photosensitive resin composition layer were counted, and the contaminant adhesion rate was calculated. A smaller contaminant adhesion rate may be evaluated as more satisfactory contaminant adhesion resistance.

[Evaluation of Sensitivity, Resolution and Adhesiveness]
<Sensitivity>

For examination of the sensitivity, the photosensitive resin composition layers of each of the photosensitive elements obtained in the manner described above were laminated on copper-clad laminates. A phototool with a 41-step tablet was then bonded to the photosensitive resin composition layer and exposed to light at 70 mJ/cm². The sensitivity was evaluated based on the number of steps remaining after development. The results are shown in Table 2. A greater number of remaining step tablet steps (a larger numerical value) represents higher sensitivity.

<Resolution>

First, the photosensitive resin composition layer photosensitive element was laminated on a copper-clad laminate in the same manner as for evaluation of the sensitivity. Next, a phototool with a 41-step tablet and a phototool having a wiring pattern with a line width/space width of 30/30-200/200 (units: μm) as a negative for evaluation of resolution were bonded to the photosensitive resin composition layer, and exposure was carried out with an energy dose for 23 remaining steps after development of the 41-step tablet. The smallest value for the space width between line widths that allowed clean removal of the unexposed sections by developing treatment was recorded as the resolution. The results are shown in Table 2. For this evaluation, a smaller numerical value represents more satisfactory resolution.

<Adhesiveness>

First, the photosensitive resin composition layer of the photosensitive element was laminated on a copper-clad laminate in the same manner as for evaluation of the resolution. Next, a phototool with a 41-step tablet and a phototool having a wiring pattern with a line width/space width of 6-47 (units: μm) as a negative for evaluation of resolution were bonded to the photosensitive resin composition layer, and exposure was carried out with an energy dose for 23 remaining steps after development of the 41-step tablet. The adhesiveness was evaluated based on the smallest value of the line width that permitted bonding without peeling after development. The results are shown in Table 2. For this evaluation, a smaller minimum line width value represents more satisfactory adhesiveness.

The results of the evaluations of the photosensitive elements of Examples 1-4 and Comparative Example 1 as described above are summarized in Table 2.

TABLE 2

|  | Example 1 | Example 2 | Example 3 | Example 4 | Comparative Example 1 |
|---|---|---|---|---|---|
| Irregular tent tear rate (%) | 4 | 3 | 2 | 2 | 80 |
| Contaminant adhesion rate (%) | 12 | 13 | 8 | 10 | 52 |
| Sensitivity (steps) | 23 | 23 | 23 | 23 | 23 |
| Resolution (μm) | 50 | 50 | 50 | 50 | 50 |
| Adhesiveness (μm) | 25 | 25 | 25 | 25 | 25 |

As shown by the results in Table 2, the photosensitive elements fabricated from photosensitive resin compositions of the invention (Examples 1-4) exhibited sufficiently high sensitivity, resolution and adhesiveness, and were confirmed to have lower irregular tent tear rates and contaminant adhesion rates than the photosensitive element fabricated from the photosensitive resin composition of Comparative Example 1. This confirmed that the photosensitive resin composition of the invention can form satisfactory resist patterns and allows efficient production even with highly densified printed circuit boards.

INDUSTRIAL APPLICABILITY

The present invention provides a photosensitive resin composition that allows formation of photosensitive resin composition layers with excellent contaminant adhesion resistance while also allowing formation of cured films with excellent tent reliability, as well as a photosensitive element, resist pattern forming method and printed circuit board production process employing the same.

The invention claimed is:

1. A photosensitive resin composition comprising (A) a binder polymer containing a carboxyl group, (B) a photopolymerizing compound with at least one polymerizable ethylenic unsaturated bond in the molecule, (C) a photopolymerization initiator and (D) a compound represented by the following general formula (1):

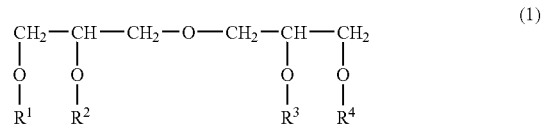

[In general formula (1), $R^1$, $R^2$, $R^3$ and $R^4$ each independently represent hydrogen or a monovalent group represented by the following general formula (2):

(In general formula (2), $R^5$ represents a C4-30 hydrocarbon group)].

2. A photosensitive resin composition according to claim 1, containing, as the compound represented by general formula (1), a compound of general formula (1) wherein at least one of $R^1$, $R^2$, $R^3$ and $R^4$ is a monovalent group represented by general formula (2) above, and $R^5$ in general formula (2) is a C4-30 aliphatic hydrocarbon group.

3. A photosensitive element comprising a support film and a photosensitive resin composition layer composed of a photosensitive resin composition according to claim 2 formed on the support film.

4. A resist pattern forming method, comprising:
laminating a photosensitive resin composition layer of a photosensitive element according to claim 3 on a circuit-forming board, irradiating the photosensitive resin composition layer with active light rays in an image pattern for photocuring of the exposed sections, and removing the sections other than the exposed sections.

5. A process for production of a printed circuit board, comprising:
forming a resist pattern on a circuit-forming board by the resist pattern forming method according to claim 4; and
etching or plating the circuit-forming board having the resist pattern.

6. A photosensitive element characterized by comprising a support film and a photosensitive resin composition layer composed of a photosensitive resin composition according to claim 1 formed on the support film.

7. A resist pattern forming method, comprising:
laminating a photosensitive resin composition layer of a photosensitive element according to claim 6 on a circuit-forming board, irradiating the photosensitive resin composition layer with active light rays in an image pattern for photocuring of the exposed sections, and removing the sections other than the exposed sections.

8. A process for production of a printed circuit board, comprising:
forming a resist pattern on a circuit-forming board by the resist pattern forming method according to claim 7; and
etching or plating the circuit-forming board having the resist pattern.

9. A photosensitive resin composition according to claim 1, wherein said binder polymer is obtained by radical polymerization of a carboxyl group-containing monomer with another polymerizable monomer.

10. A photosensitive resin composition according to claim 9, wherein said carboxyl group-containing monomer is (meth)acrylic acid.

11. A photosensitive resin composition according to claim 9, wherein a proportion of carboxyl group-containing monomers, with respect to a total of the polymerizable monomers, in the binder polymer, is 12-50 wt %.

12. A photosensitive resin composition according to claim 1, wherein an acid value of the binder polymer is 50-250 mgKOH/g.

13. A photosensitive resin composition according to claim 1, wherein a weight-average molecular weight of the binder polymer is 20,000-300,000.

14. A photosensitive resin composition according to claim 1, wherein a proportion of monovalent groups represented by general formula (2) distributed among $R^1$-$R^4$ is 10-80%.

15. A photosensitive resin composition according to claim 1, wherein a ratio [$M_{OH}/M_{ESTER}$] between a total moles of hydroxyl groups $M_{OH}$ in the compound represented by general formula (1) and a total moles of ester groups, where $R^1$-$R^4$ represent a monovalent group represented by the general formula (2), is in a range of 0.1-4.

16. A photosensitive resin composition according to claim 1, wherein $R^1$, $R^2$, $R^3$ and $R^4$ each independently represent hydrogen or —CO—$C_{17}H_{33}$, and a distribution of —CO—$C_{17}H_{33}$ among $R^1$, $R^2$, $R^3$ and $R^4$ is 10-80%.

17. A photosensitive resin composition according to claim 16, wherein the distribution of —CO—$C_{17}H_{33}$ among $R^1$, $R^2$, $R^3$ and $R^4$ is 30-40%.

18. A photosensitive resin composition according to claim 1, wherein a content of the binder polymer containing a carboxyl group is 30-80 parts by weight, a content of the photopolymerizing compound is 20-60 parts by weight, a content of the photopolymerization initiator is 0.01-20 parts by weight, and a content of the compound represented by the general formula (1) is 0.01-20 parts by weight, each with respect to 100 parts by weight of the total of the binder polymer and the photopolymerizing compound.

19. A photosensitive resin composition according to claim 1, having properties that it avoids electrical charge buildup and tent tearing in a cured film of the photosensitive resin composition.

* * * * *